US009597683B2

(12) United States Patent
Watanabe et al.

(10) Patent No.: US 9,597,683 B2
(45) Date of Patent: Mar. 21, 2017

(54) MICROCHIP AND METHOD OF PRODUCING MICROCHIP

(71) Applicant: Sony Corporation, Tokyo (JP)

(72) Inventors: Hidetoshi Watanabe, Chiba (JP); Yuji Segawa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/851,139

(22) Filed: Sep. 11, 2015

(65) Prior Publication Data

US 2016/0001287 A1 Jan. 7, 2016

Related U.S. Application Data

(63) Continuation of application No. 13/577,391, filed as application No. PCT/JP2011/000535 on Feb. 1, 2011, now Pat. No. 9,132,424.

(30) Foreign Application Priority Data

Feb. 10, 2010 (JP) ................................ 2010-028241

(51) Int. Cl.

*B01L 99/00* (2010.01)
*B81B 3/00* (2006.01)
*B01L 3/00* (2006.01)

(52) U.S. Cl.

CPC ......... *B01L 3/5027* (2013.01); *B01L 3/50273* (2013.01); *B01L 2200/0689* (2013.01); *B01L 2200/10* (2013.01); *B01L 2200/141* (2013.01); *B01L 2300/044* (2013.01); *B01L 2300/0887* (2013.01); *B01L 2300/12* (2013.01); *B01L 2300/123* (2013.01); *B01L 2400/049* (2013.01)

(58) Field of Classification Search

CPC ............. B01L 3/5027; B01L 2300/123; B01L 2300/044; B01L 2300/0887; B01L 2400/049; B81B 3/0097

See application file for complete search history.

(56) References Cited

U.S. PATENT DOCUMENTS 6,521,188 B1 * 2/2003 Webster .............. B01L 3/50273 137/14
7,111,501 B2 9/2006 Rocklin et al.
9,132,424 B2 * 9/2015 Watanabe ........... B01L 3/50273
2002/0166585 A1 * 11/2002 O'Connor ............. B01L 3/5025 137/87.01

(Continued)

FOREIGN PATENT DOCUMENTS

EM 1707267 10/2006
JP 2000-508528 7/2000

(Continued)

OTHER PUBLICATIONS

Decision of refusal issued in connection with Japanese Patent Application No. 2013-036111, dated Aug. 26, 2014. (3 pages).

(Continued)

*Primary Examiner* — Paul Hyun

(74) *Attorney, Agent, or Firm* — K&L Gates LLP

(57) ABSTRACT

A microchip is provided. The microchip includes a substrate structure including a fluid channel configured to contain a sample solution, wherein the fluid channel is maintained at a pressure lower than atmospheric pressure prior to injection of the sample solution into the fluid channel.

14 Claims, 9 Drawing Sheets

(56) References Cited

U.S. PATENT DOCUMENTS

| | | | | |
|---|---|---|---|---|
| 2002/0187564 | A1* | 12/2002 | Chow | B01L 3/5025 506/39 |
| 2002/0195152 | A1* | 12/2002 | Fernandes | B01L 3/50273 137/803 |
| 2003/0040119 | A1* | 2/2003 | Takayama | B01L 3/502761 436/63 |
| 2003/0049659 | A1 | 3/2003 | Lapidus et al. | |
| 2003/0064507 | A1 | 4/2003 | Gallagher et al. | |
| 2003/0138969 | A1 | 7/2003 | Jakobsen et al. | |
| 2004/0132166 | A1* | 7/2004 | Miller | B01L 3/502707 435/286.1 |
| 2009/0082652 | A1 | 3/2009 | Koh et al. | |

FOREIGN PATENT DOCUMENTS

| | | |
|---|---|---|
| JP | 2004-150891 | 5/2004 |
| JP | 2004-219199 | 8/2004 |
| JP | 2005-021866 | 1/2005 |
| JP | 2006-029485 | 2/2006 |
| JP | 2006-234791 | 9/2006 |
| JP | 2009-042103 | 2/2009 |
| JP | 2009-250830 | 10/2009 |
| JP | 2009-284769 | 12/2009 |
| WO | 97/36681 | 10/1997 |
| WO | 03/045557 | 6/2003 |

OTHER PUBLICATIONS

Office Action issued in connection with Japanese Patent Application No. 2013-036111, dated Jun. 3, 2014. (8 pages).

State Intellectual Property Office of P.R. C .. Notification of the First Office Action issued in connection with P.R. C. Application No. 201180008428.5, dated Jan. 13, 2014. (19 pages).

Notification of reasons for refusal issued in connection with Japanese Patent Application No. 2010-028241, dated Nov. 20, 2012. (6 pages).

* cited by examiner

MICROCHIP AND METHOD OF PRODUCING MICROCHIP

CROSS REFERENCES TO RELATED APPLICATIONS

The present application is a continuation of U.S. patent application Ser. No. 13/577,391, filed on Aug. 6, 2012 and will issue as U.S. Pat. No. 9,132,424 on Sep. 15, 2015, which was a national stage of International Application No. PCT/JP2011/000535 filed on Feb. 1, 2011 and claims priority to Japanese Patent Application No. 2010-028241 filed on Feb. 10, 2010, the entire content of which is hereby incorporated by reference.

BACKGROUND

The present application relates to a microchip and a method of producing the microchips. More particularly, the present application relates to a microchip used for chemically or biologically analyzing a substance which is introduced into regions arranged on a substrate of the microchip.

Recently, microchips in which wells or flow passages are provided, which are used for performing a chemical or biological analysis on a silicon or glass substrate, have been developed, applying fine processing technologies in semiconductor industries (See, for example, Patent Literature 1). These microchips are beginning to be utilized in, for example, electrochemical detectors of liquid chromatography, and compact size electrochemical sensors in medical fields.

An analysis system using such microchips is called a micro-Total-Analysis System (μ-TAS), lab-on-chip or biochip, which receives attention as a technique enabling chemical and biological analyses to speed up, further improve in efficiency or integration, or analyzers to minimize.

The μ-TAS is expected to be applied to biological analysis handling particularly valuable, microvolume samples or a lot of specimens, because it can analyze a sample even in a small amount, or microchips used therein can be disposable.

As an application utilizing the μ-TAS, there are optical detectors in which a substance is introduced into multiple regions arranged on a microchip, and the substance is optically detected. Examples of the optical detector may include an electrophoresis apparatus in which multiple substances are separated in a flow passage on a microchip by electrophoresis and each substance separated is optically detected, and a reaction apparatus (for example a real-time PCR apparatus) in which multiple substances are reacted in wells on a microchip and the resulting substances are optically detected.

In the μ-TAS, because a sample is used in a trace amount, it is difficult to introduce the sample solution into wells or a flow passage, the introduction of the sample solution may be inhibited due to air existing within the wells and the like, and it may take a long time to introduce the sample. In addition, when a sample solution is introduced, air voids may be generated within wells and the like. Consequently, the amounts of the sample solution introduced into the wells vary, thus resulting in a lowering of the precision or efficiency of analysis. When a sample is heated, as in PCR, air voids remaining in wells expand, which inhibits the reaction or decreases the precision of analysis.

In order to easily introduce the sample solution in the μ-TAS, for example, Patent Literature 2 discloses a "substrate including at least a sample-introducing part for introducing the samples, a plurality of storing parts for storing the samples, and a plurality of air-discharging parts connected to the storing parts, in which two or more of the air-discharging parts are communicated with one open channel having one opened terminal." In this substrate, the air-discharging part is connected to each of the storing parts, and therefore when the sample solution is introduced from the sample-introducing part to the storing parts, the air existing in the storing parts is discharged from the air-discharging parts, with the result that the sample solution can smoothly be filled into the storing parts.

CITATION LIST

Patent Literature

[PTL 1] Japanese Patent Application Laid-open No. 2004-219199

[PTL 2] Japanese Patent Application Laid-open No. 2009-284769

SUMMARY

As stated above, according to the known μ-TAS, it is difficult to introduce a sample solution into wells or a flow passage, the introduction of the sample solution may be inhibited due to air existing within wells and the like, and it may take a long time to introduce a sample. In addition, when the sample solution is introduced, air voids may be generated within wells and the like. For these reasons, problems arise in the precision or efficiency of analysis.

It is desirable to provide a microchip capable of easily introducing a sample solution in a short time, and obtaining the high precision of analysis.

In an embodiment, a microchip is provided. The microchip includes a substrate structure including a fluid channel configured to contain a sample solution, wherein the fluid channel is maintained at a pressure lower than atmospheric pressure prior to injection of the sample solution into the fluid channel.

In an embodiment, the fluid channel is configured to analyze the sample solution.

In an embodiment, the substrate structure includes at least one substrate layer that includes an elastic material.

In an embodiment, the elastic material includes at least one constituent selected from the group consisting of a silicone elastomer including polydimethyl siloxane, an acrylic elastomer, a urethane elastomer, a fluorine-containing elastomer, a styrene elastomer, an epoxy elastomer, and a natural rubber.

In an embodiment, the substrate structure includes at least one self-sealing substrate layer configured to allow self-sealing of the substrate structure subsequent to injection of the sample solution.

In an embodiment, the substrate structure includes at least one gas-impermeable substrate layer.

In an embodiment, the gas-impermeable substrate layer includes any one of a plastic material, a metal, and a ceramic.

In an embodiment, the fluid channel includes at least one injection site; at least one fluid well; and at least one fluid flow passage.

In an embodiment, the at least one injection site is configured for puncture-injecting the sample solution into the substrate structure; wherein the at least one fluid well is configured to contain the sample solution or a reaction product thereof; and wherein the at least one fluid flow passage is configured to allow flow of the sample solution in fluid communication with the at least one injection site and the at least one fluid well.

In another embodiment, a method of manufacturing a microchip is provided. The method includes forming a substrate structure including a fluid channel configured to contain a sample solution, wherein the fluid channel is maintained at a pressure lower than atmospheric pressure prior to injection of the sample solution into the fluid channel.

In an embodiment, the fluid channel is configured to analyze the sample solution.

In an embodiment, the substrate structure includes at least one substrate layer that includes an elastic material.

In an embodiment, the elastic material includes at least one constituent selected from the group consisting of a silicone elastomer including polydimethyl siloxane, an acrylic elastomer, a urethane elastomer, a fluorine-containing elastomer, a styrene elastomer, an epoxy elastomer, and a natural rubber.

In an embodiment, the substrate structure includes at least one self-sealing substrate layer configured to allow self-sealing of the substrate structure subsequent to injection of the sample solution.

In an embodiment, the substrate structure includes at least one gas-impermeable substrate layer.

In an embodiment, the gas-impermeable substrate layer includes any one of a plastic material, a metal, and a ceramic.

In an embodiment, the fluid channel includes at least one injection site; at least one fluid well; and at least one fluid flow passage.

In an embodiment, the at least one injection site is configured for puncture-injecting the sample solution into the substrate structure; wherein the at least one fluid well is configured to contain the sample solution or a reaction product thereof; and wherein the at least one fluid flow passage is configured to allow flow of the sample solution in fluid communication with the at least one injection site and the at least one fluid well.

According to an embodiment, a microchip capable of easily introducing a sample solution in a short time and obtaining the high precision of analysis can be provided.

Additional features and advantages are described herein, and will be apparent from the following Detailed Description and the figures.

DETAILED DESCRIPTION

Embodiments of the present application will be described below in detail with reference to the drawings.

Figure 1:
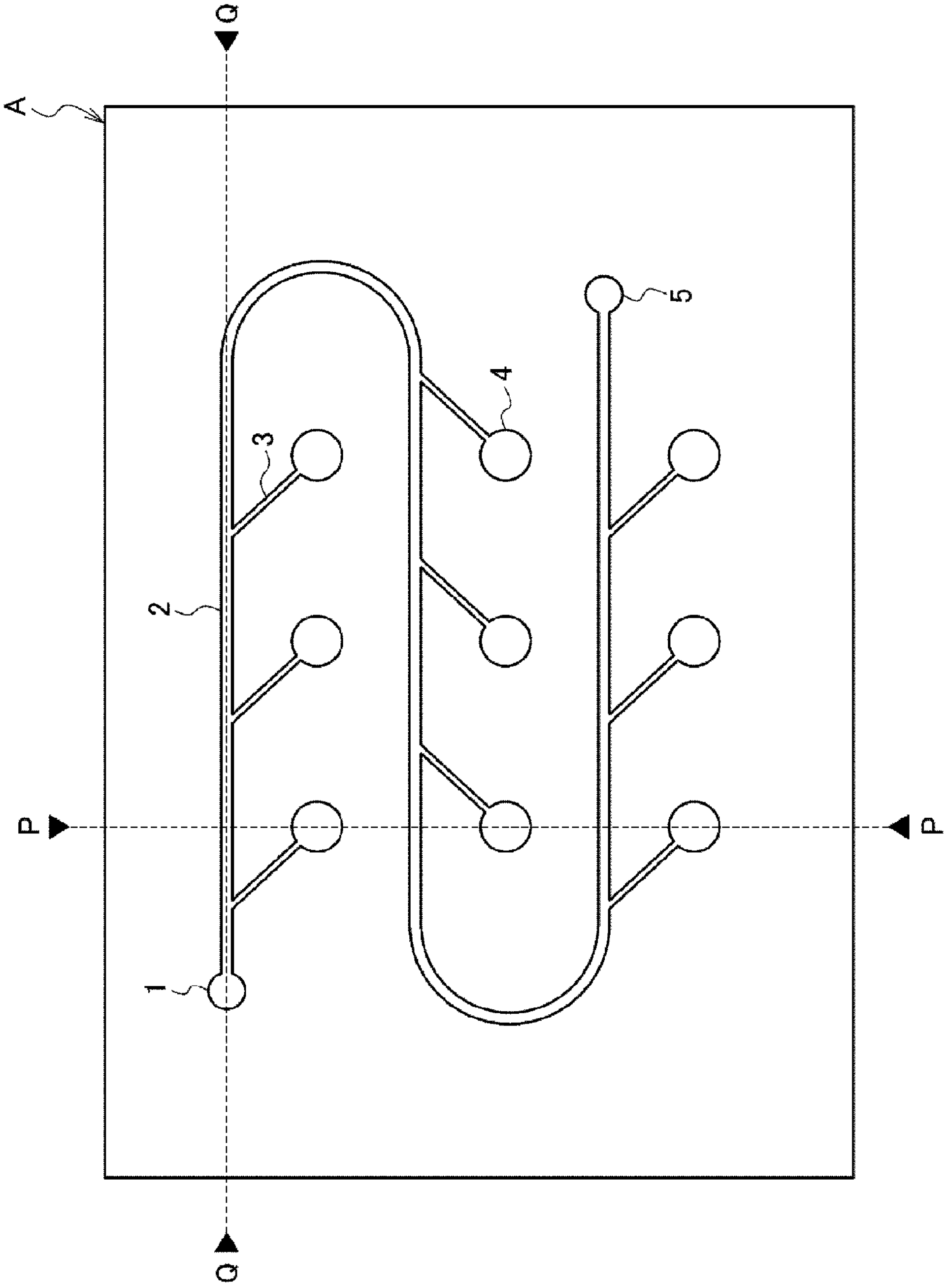
FIG. 1 is a schematic view of a top surface of a microchip A according to a first embodiment.
Figure 2:
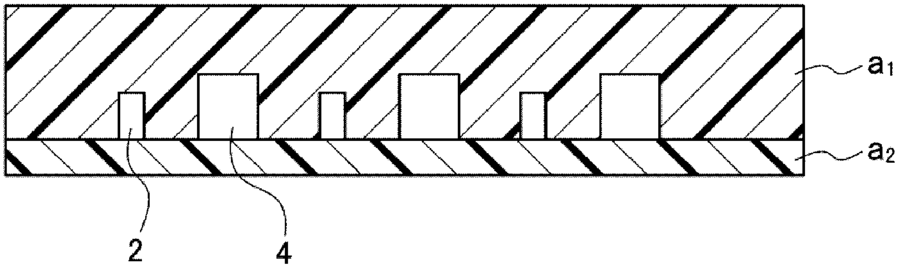
FIG. 2 is a cross-sectional schematic view of the microchip A (a P-P cross-section in FIG. 1).
Figure 3:
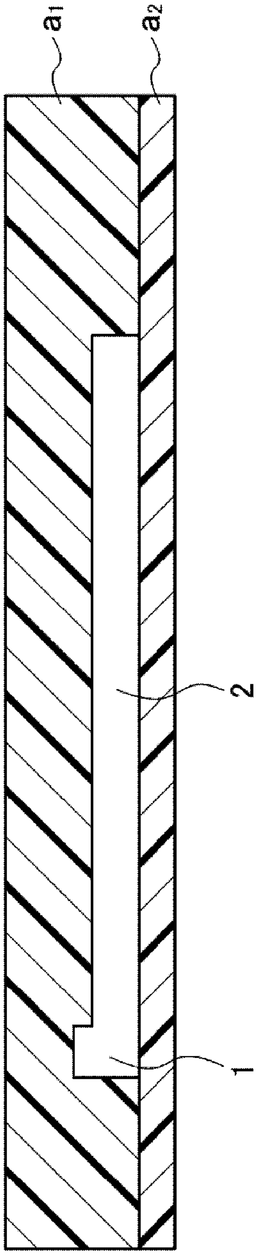
FIG. 3 is a cross-sectional schematic view of the microchip A (a Q-Q cross-section in FIG. 1).

1. Microchip A According to First Embodiment (1-1) A Structure and a Forming Method of the Microchip A (1-2) Introduction of a Sample Solution into the Microchip A 2. Microchip B According to Second Embodiment (2-1) A Structure of the Microchip B (2-2) Introduction of a Sample Solution into the Microchip B 3. Microchip C According to Third Embodiment (3-1) A Structure and a Forming Method of the Microchip C (3-2) Introduction of a Sample Solution into the Microchip C 1. Microchip According to First Embodiment (1-1) A Structure and a Forming Method of the Microchip A The schematic view of the top surface of a microchip according to the first embodiment is shown in FIG. 1, and the cross-sectional schematic views thereof are shown in FIG. 2 and FIG. 3. FIG. 2 corresponds to the P-P cross-section in FIG. 1, and FIG. 3 corresponds to the Q-Q cross-section in FIG. 1.

On a microchip A, an injection site (injection region) 1 for puncture-injecting a sample solution from the outside; multiple wells 4, each of which is a place for analyzing a substance contained in the sample solution or a reaction product of the substance; a main flow passage 2 which communicates with the injection site 1 at one end; and branched flow passages 3 which are branched from the main flow passage 2, are arranged. The other end of the main flow passage 2 is formed as a terminal site (terminal region) 5, and the branched flow passages 3 are branched from the main flow passage 2 between the communication part with the injection site 1 and the communication part with the terminal site 5 in the main flow passage 2, and are connected to the wells 4.

The microchip A has a structure in which a substrate layer $a_1$ on which the injection site 1, the main flow passage 2, the branched flow passages 3, the wells 4 and the terminal site 5 are formed, is laminated with a substrate layer $a_2$. In the microchip A, the substrate layer $a_1$ is laminated with the substrate layer $a_2$ under a pressure negative to atmospheric pressure, with the result that the injection site 1, the main flow passage 2, the branched flow passages 3, the wells 4 and the terminal site 5 are air-tightly sealed so that the inner pressure thereof is negative to atmospheric pressure (for example, 1/100 atm). It is more desirable that the lamination of the substrate layer $a_1$ with the substrate layer $a_2$ be performed in vacuo, with the result that the layers are air-tightly sealed so that the inside of the injection site 1 or the like is in vacuo.

Although the materials of the substrate layers $a_1$ and $a_2$ can be glass or various plastics (polypropylene, polycarbonate, cycloolefin polymers, and polydimethyl siloxane), it is desirable that at least one of the substrate layers $a_1$ and $a_2$ be made of an elastic material. The elastic materials may include silicone elastomers such as polydimethyl siloxane (PDMS), as well as acrylic elastomers, urethane elastomers, fluorine-containing elastomers, styrene elastomers, epoxy elastomers, natural rubbers, and the like. When at least one of the substrate layers $a_1$ and $a_2$ is formed of the elastic material, self-sealing property, as explained below, can be imparted to the microchip A.

When the substance introduced into the wells 4 is optically analyzed, it is desirable to select a material having light-permeability, small autofluorescence, and small optical error due to small wavelength dispersion, as the material for the substrate layer $a_1$ or $a_2$.

The injection site 1, the main flow passage 2, the branched flow passages 3, the wells 4 and the terminal site 5 can be formed into the substrate layer $a_1$ by, for example, wet-etching or dry-etching a glass substrate layer, or nano-in-printing, injection molding or cutting processing a plastic substrate layer. The injection site 1 and the like may be formed on the substrate layer $a_2$, or a part thereof may be formed on the substrate layer $a_1$ and the remaining part may be formed on the substrate layer $a_2$.

The substrate layer $a_1$ can be laminated with the substrate layer $a_2$ by a known method such as a thermal fusion bonding, a bonding using an adhesive, an anodic bonding, a bonding using a pressure-sensitive adhesive sheet, a plasma activation bonding, or an ultrasonic bonding.

(1-2) Introduction of a Sample Solution into the Microchip A

Next, also referring to FIGS. 4, the introduction method of the sample solution into the microchip A will be explained. FIG. 4 are the cross-sectional schematic views of the microchip A, which correspond to the Q-Q cross-section in FIG. 1.

Figure 4A:
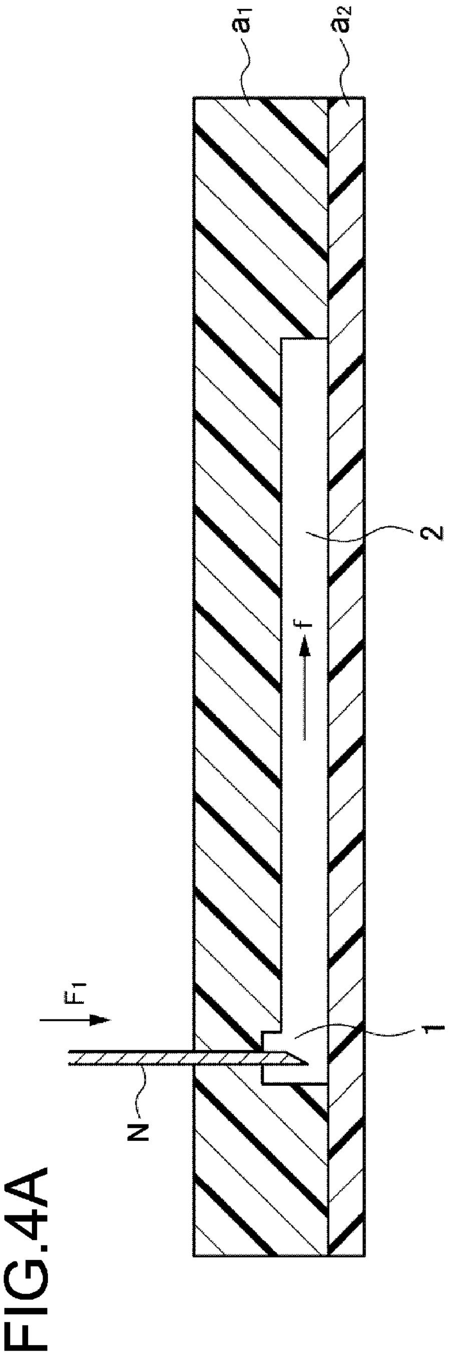
FIGS. 4A and 4B are views illustrating a method of introducing a sample solution into the microchip A, which are schematic views of a cross-section corresponding to the Q-Q cross-section in FIG. 1.

The sample solution is introduced into the microchip A, as shown in FIG. 4A, by puncture-injecting the sample solution into the injection site 1 with a needle N. In the figure, the arrow $F_1$ shows the puncturing direction of the needle N. The substrate layer $a_1$ is punctured with the needle N from the surface of the substrate layer $a_1$ such that the tip part thereof can reach an inner space of the injection site 1.

The sample solution introduced into the injection site 1 from the outside is sent toward the terminal site 5 in the main flow passage 2 (see arrow f in FIG. 4A), and the sample solution is introduced into the inside of the branched flow passages 3 and the wells 4 sequentially starting from the branched flow passage 3 and the well 4 arranged upstream of the sending direction of the solution (see also FIG. 1).

At this time, because the inner pressure of the injection site 1, the main flow passage 2, the branched flow passages 3, the wells 4 and the terminal site 5 in the microchip A is set negative to atmospheric pressure, the sample solution introduced into the injection site 1 is sent to the terminal site 5 as aspirated due to the negative pressure, with the result that the sample solution can be smoothly introduced into the wells 4 in the microchip A in a short time.

Further, when the inside of the injection site 1, the main flow passage 2, the branched flow passages 3, the wells 4 and the terminal site 5 is in vacuo, the introduction of the sample solution is not inhibited by air, or air voids are not generated inside the wells 4, because of the absence of air inside the wells 4.

Figure 4B:
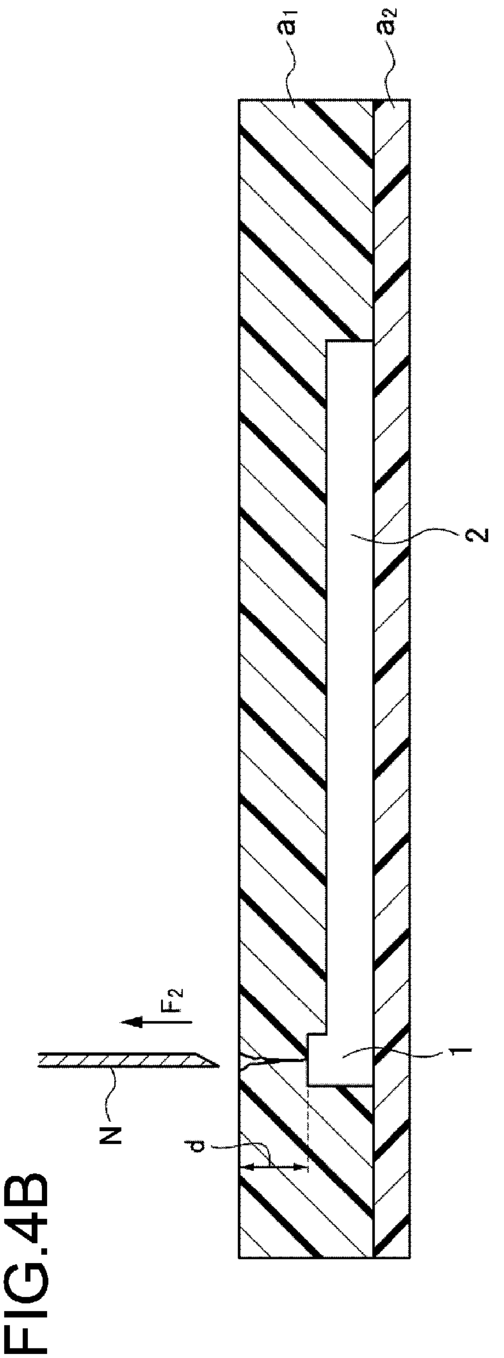

After the sample solution is introduced, as shown in FIG. 4B, the needle N is pulled out, and the punctured part of the substrate layer a1 is sealed.

At this time, when the substrate layer a1 is formed of the elastic material such as PDMS, the punctured part can be spontaneously sealed by the restoring force owing to the elastic deformation of the substrate layer a1, after the needle N is pulled out. In an embodiment, the spontaneous sealing of the needle-punctured part by the elastic deformation of the substrate layer is referred to as "self-sealing property" of a substrate layer.

In order to further improve the self-sealing property of the substrate layer a1, it is desirable that a thickness from the surface of the substrate layer a1 to the surface of the inner space of the injection site 1 at the punctured part (see reference sign d in FIG. 4B) be set within an appropriate range depending on the material for the substrate layer a1 or the diameter of the needle N. When the microchip A is heated during the analysis, the thickness d is decided so that the self-sealing property is not lost due to the increase of the inner pressure caused by heating.

In order to ensure the self-sealing due to the elastic deformation of the substrate layer a1, it is desirable to use a needle N having a smaller diameter, so long as the sample solution can be injected. More specifically, painless needles having an external tip diameter of about 0.2 mm, used as an injection needle for insulin, are desirably used. In order to easily inject the sample solution, a generally-used chip for micropipette whose tip is cut, may be connected to the base of the painless needle. When the sample solution is filled in the tip part of the chip, and the painless needle is punctuated into the injection site 1, the sample solution filled in the tip part of the chip connected to the painless needle can be aspirated into the injection site 1 by the negative pressure in the microchip A.

When a painless needle having an outer tip diameter of 0.2 mm is used as the needle N, the thickness d of the substrate layer a1 made of PDMS is desirably 0.5 mm or more, and it is desirably 0.7 mm or more when it is heated.

In this embodiment, the microchip on which nine wells 4 are arranged at equal intervals in three vertical rows and three horizontal rows is explained as an example, but the number of the wells and the positions of the arrangement may be arbitrary, and the shape of the well 4 is not also limited to the cylinder shown in the figures. The arrangement positions of the main flow passage 2 and the branched flow passages 3, which are used for sending the sample solution introduced into the injection site 1 to the wells 4, are not also limited to the embodiment shown in the figures. In addition, in this embodiment, the case where the substrate layer a1 is formed of the elastic material, and is punctured with the needle N from the surface of the substrate layer a1 is explained. The needle N, however, may be used for the puncturing from the surface of the substrate layer a2. In this case, the substrate layer a2 may be formed of the elastic material, thereby imparting the self-sealing property thereto.

Figure 5:
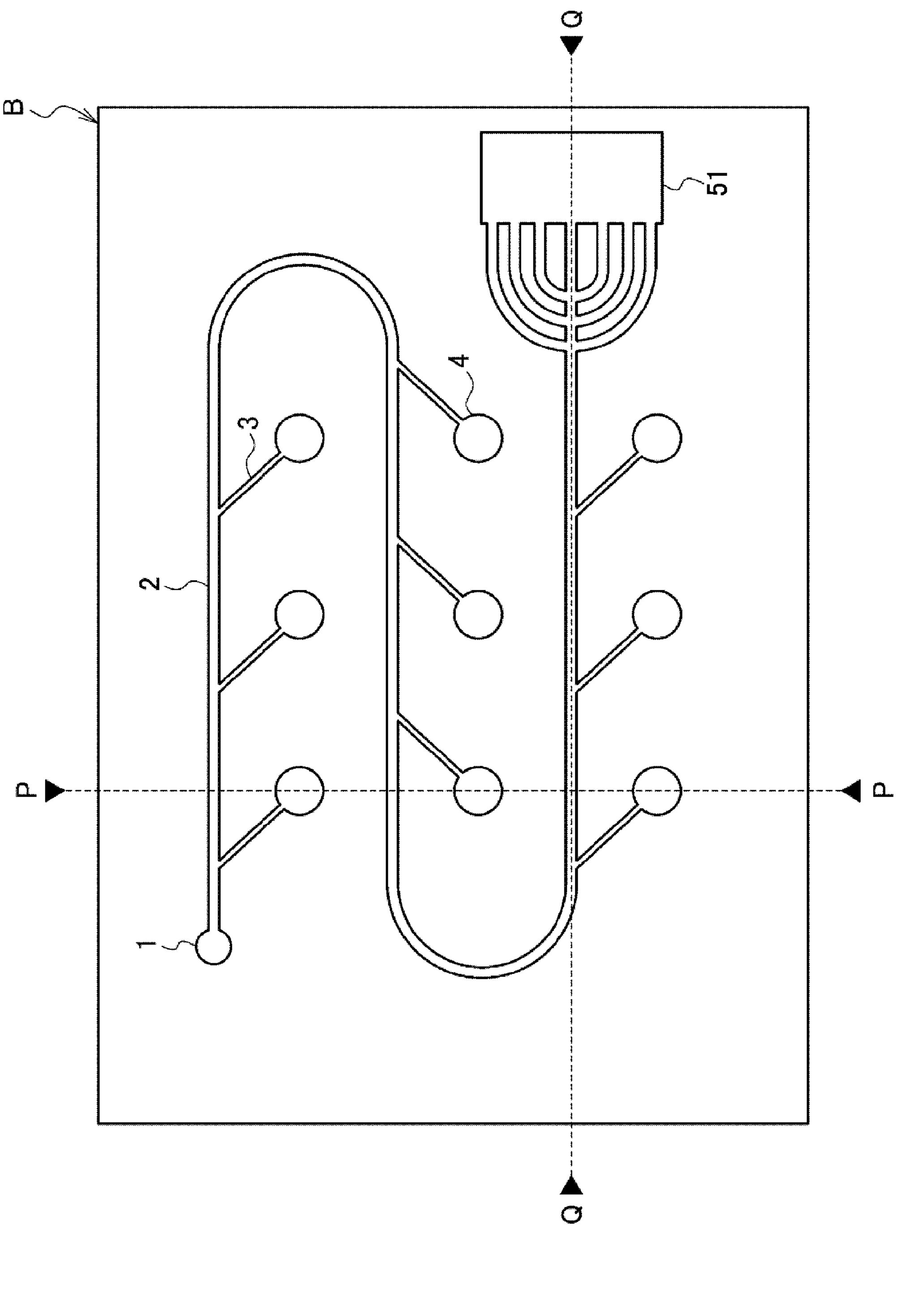
FIG. 5 is a schematic view of a top surface of a microchip B according to a second embodiment.
Figure 6:
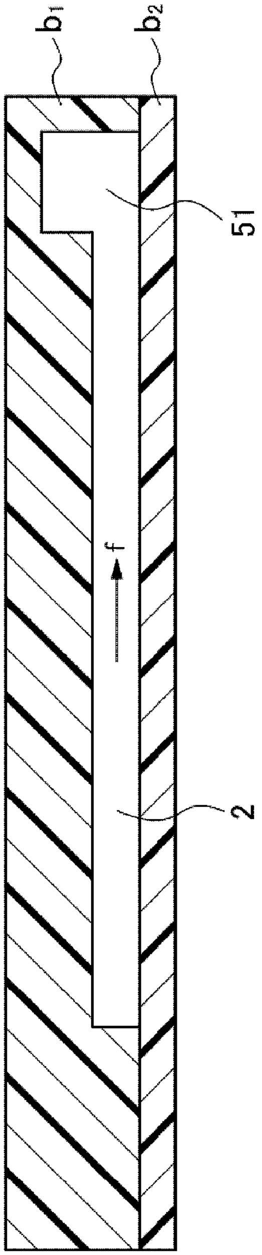
FIG. 6 is a cross-sectional schematic view of the microchip B (a Q-Q cross-section in FIG. 5).

2. Microchip According to Second Embodiment (2-1) A Structure of the Microchip B The schematic view of the top surface of a microchip according to the second embodiment is shown in FIG. 5, and the cross-sectional schematic view thereof is shown in FIG. 6. FIG. 6 corresponds to the Q-Q cross-section in FIG. 5. The P-P cross-section in FIG. 5 is the same as that of the microchip A according to the first embodiment (see FIG. 2), and therefore the illustration thereof is omitted here.

On a microchip B, an injection site (injection region) 1 for puncture-injecting a sample solution from the outside; multiple wells 4, each of which is a place for analyzing a substance contained in the sample solution or a reaction product of the substance; a main flow passage 2 which communicates at one end with the injection site 1; and branched flow passages 3 which are branched from this main flow passage 2, are arranged. The other end of the main flow passage 2 is formed as a vacuum tank (terminal region) 51, and the branched flow passages 3 are branched from the main flow passage 2 between the communication part with the injection site 1 and the communication part with the vacuum tank 51 in the main flow passage 2, and are connected to the individual wells 4.

The microchip B is different from the microchip A in that the terminal regions of the microchips B and A, communicated with one end of the main flow passage 2, are formed as the vacuum tank 51 and the terminal site 5, respectively. The internal volume of the vacuum tank 51 in the microchip B is made larger than that of the well 4. On the other hand, the internal volume of the terminal site 5 in the microchip A is not particularly limited, and may be arbitrary.

The microchip B has a structure in which a substrate layer $b_1$ on which the injection site 1, the main flow passage 2, the branched flow passages 3, the wells 4 and the vacuum tank 51 are formed, is laminated with a substrate layer $b_2$. In the microchip B, the substrate layer $b_1$ is laminated with the substrate layer $b_2$ under a pressure negative to atmospheric pressure, with the result that the injection site 1, the main flow passage 2, the branched flow passages 3, the wells 4 and the vacuum tank 51 are air-tightly sealed so that the inner pressure thereof is negative to atmospheric pressure (for example, 1/100 atm). It is more desirable that the lamination of the substrate layer $b_1$ with the substrate layer $b_2$ be performed in vacuo, with the result that the layers are air-tightly sealed so that the inside of the injection site 1 or the like is in vacuo.

In this case, a larger negative pressure, compared to the pressure in the well 4, the main flow passage 2 or the branched flow passages 3, or vacuum is stored in the vacuum tank 51, because of the larger internal volume thereof.

The materials of the substrate layers b1 and b2, and the forming method of the injection site 1 or the like into the substrate layer can be the same as in the microchip A.

(2-2) Introduction of a Sample Solution into the Microchip B

Next, also referring to FIGS. 4, the introduction method of the sample solution into the microchip B will be explained. FIG. 4 are the cross-sectional schematic views corresponding to the Q-Q cross-section in FIG. 1 of the microchip A, and the cross-sectional schematic views can be also applied to the microchip B.

The sample solution is introduced into the microchip B, as shown in FIG. 4A, by puncture-injecting the sample solution into the injection site 1 with a needle N. In the figure, the arrow F1 shows the puncturing direction of the needle N. The substrate layer b1 is punctured with the needle N from the surface of the substrate layer b1 such that the tip part thereof can reach an inner space of the injection site 1.

The sample solution introduced into the injection site 1 from the outside is sent toward the vacuum tank 51 in the main flow passage 2, and the sample solution is introduced into the inside of the branched flow passages 3 and the wells 4 sequentially starting from the branched flow passage 3 and the well 4 arranged upstream of the sending direction of the solution.

At this time, because the inner pressure of the injection site 1, the main flow passage 2, the branched flow passages 3, and the wells 4 in the microchip B is set negative to atmospheric pressure, the sample solution introduced into the injection site 1 is sent as aspirated due to the negative pressure.

In addition, in the microchip B, the vacuum tank 51 having a larger internal volume, compared to the wells 4, and storing a larger negative pressure or vacuum, is provided as the terminal region of the main flow passage 2, and therefore the sample solution can be sent by aspirating with a large negative pressure (see arrow f in FIG. 6).

Consequently, according to the microchip B, the sample solution can be more smoothly introduced into the inside of the wells 4 or the like in a shorter time than the microchip A.

As shown in FIG. 5, when the communication part of the main flow passage 2 with the vacuum tank 51 is radially branched, the negative pressure or the vacuum within the vacuum tank 51 can be effectively applied to the sample solution.

Further, when the inside of the injection site 1, the main flow passage 2, the branched flow passages 3, the wells 4 and the vacuum tank 51 is in vacuo, the introduction of the sample solution is not inhibited by air, or air voids are not generated inside the wells 4 or the like, because of the absence of air inside the wells 4 or the like.

After the sample solution is introduced, as shown in FIG. 4B, the needle N is pulled out, and the punctured part of the substrate layer $b_1$ is sealed. At this time, when the substrate layer $b_1$ is formed of the elastic material such as PDMS, the punctured part can be spontaneously sealed by the restoring force owing to the elastic deformation of the substrate layer $b_1$, after the needle N is pulled out.

In this embodiment, the microchip on which nine wells 4 are arranged at equal intervals in three vertical rows and three horizontal rows is explained as an example, but the number of the wells and the positions of the arrangement may be arbitrary, and the shape of the well 4 is not also limited to the cylinder shown in the figures. The arrangement positions of the main flow passage 2 and the branched flow passages 3, which are used for sending the sample solution introduced into the injection site 1 to the wells 4, are not also limited to the embodiment shown in the figures. In addition, in this embodiment, the case where the substrate layer $b_1$ is formed of the elastic material, and is punctured with the needle N from the surface of the substrate layer $b_1$ into the injection site 1 is explained. The needle N, however, may be used for the puncturing from the surface of the substrate layer $b_2$. In this case, the substrate layer $b_2$ may be formed of the elastic material, thereby imparting the self-sealing property thereto.

Figure 7:
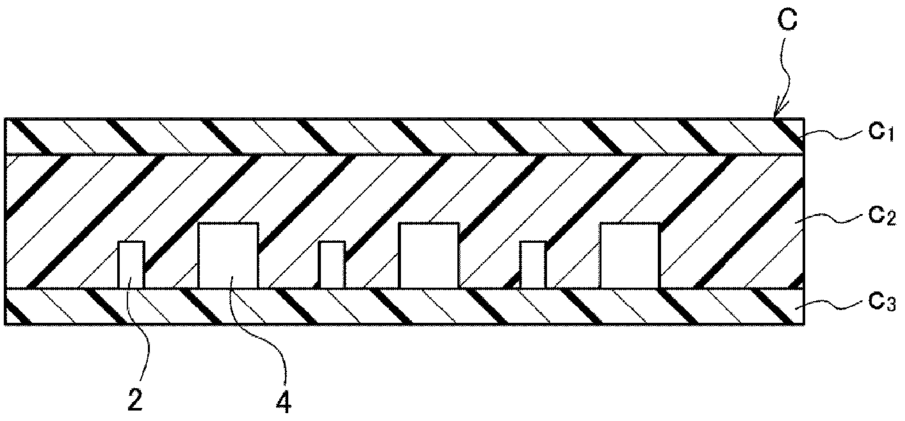
FIG. 7 is a cross-sectional schematic view of a microchip C according to a third embodiment.

3. Microchip According to Third Embodiment (3-1) A Structure and a Forming Method of the Microchip C The cross-sectional schematic views of a microchip according to the third embodiment are shown in FIG. 7 and FIG. 8.

On a microchip C, an injection site (injection region) 1 for puncture-injecting the sample solution from the outside; multiple wells 4, each of which is a place for analyzing a substance contained in the sample solution or a reaction product of the substance; and a main flow passage 2 which communicates at one end with the injection site 1, are arranged. The microchip C also includes branched flow passages 3 and a terminal site (terminal region) 5, which have the same structures as in the microchip A, though they are not shown in the figures.

The microchip C has a structure in which a substrate layer $c_2$ on which the injection site 1, the main flow passage 2, the branched flow passages 3, the wells 4 and the terminal site 5 are formed, is laminated with substrate layers $c_1$ and $c_3$. In the microchip C, the substrate layer $c_2$ on which the injection site 1 and the like are formed, is laminated with the substrate layer $c_3$ under a pressure negative to atmospheric pressure, with the result that the injection site 1, the main flow passage 2, the branched flow passages 3, the wells 4 and the terminal site 5 are air-tightly sealed so that the inner pressure thereof is negative to atmospheric pressure (for example, 1/100 atm). It is more desirable that the substrate layer $c_2$ be laminated with the substrate layer $c_3$ in vacuo, with the result that the layers are air-tightly sealed so that the inside of the injection site 1 and the like are in vacuo.

The lamination of the substrate layers $c_1$ to $c_3$ can be performed by, for example, a known method such as a thermal fusion bonding, a bonding using an adhesive, an anodic bonding, a bonding using a pressure-sensitive adhesive sheet, a plasma activation bonding, or an ultrasonic bonding.

The materials for the substrate layer $c_2$ are silicone elastomers such as polydimethyl siloxane (PDMS), as well as materials having elasticity and self-sealing property such as acrylic elastomers, urethane elastomers, fluorine-containing elastomers, styrene elastomers, epoxy elastomers and natural rubbers. The injection site 1, the main flow passage 2, the branched flow passages 3, the wells 4 and the terminal site 5 can be formed into the substrate layer $c_2$ by, for example, nano-in-printing, injection molding or cutting processing.

The PDMS is flexible and can elastically deform, but has gas-permeability. In the substrate layer made of the PDMS, therefore, when the sample solution introduced into the wells is heated, the sample solution evaporated may permeate through the substrate layer. The dissipation of the sample solution due to evaporation (liquid escape) decreases the precision of analysis, and again causes contamination of air voids into the wells.

In order to prevent this phenomenon, the microchip C has a three-layered structure in which the substrate layer $c_2$ having the self-sealing property is laminated with the substrate layers $c_1$ and $c_3$ having gas-impermeability.

Glass, plastics, metals and ceramics may be used as the materials for the substrate layers $c_1$ and $c_3$ having the gas-impermeability.

The plastics may include polymethyl methacrylate (PMMA: aclyric resins), polycarbonate (PC), polystyrene (PS), polypropylene (PP), polyethylene (PE), polyethylene terephthalate (PET), diethylene glycol bisallyl carbonate, SAN resins (styrene-acrylonitrile copolymers), MS resins (MMA-styrene copolymers), poly(4-methyl pentene-1) (TPX), polyolefins, siloxanyl methacrylate (SiMA) monomer-MMA copolymers, SiMA-fluorine-containing monomer copolymers, silicone macromer (A)-heptafluorobutyl methacrylate (HFBuMA)-MMA terpolymers, disubstituted polyacetylene polymers, and the like.

The metals may include aluminum, copper, stainless steel (SUS), silicon, titanium, tungsten, and the like.

The ceramics may include alumina ($Al_2O_3$), aluminum nitride (AlN), silicon carbide (SiC), titanium oxide ($TiO_2$), zirconia oxide ($ZrO_2$), quartz, and the like.

When the substance introduced into the wells 4 is optically analyzed, it is desirable to select a material having light-permeability, small autofluorescence, and small optical error due to small wavelength dispersion, as the material for the substrate layers $c_1$ to $c_3$.

(3-2) Introduction of a Sample Solution into the Microchip C

Figure 8A:
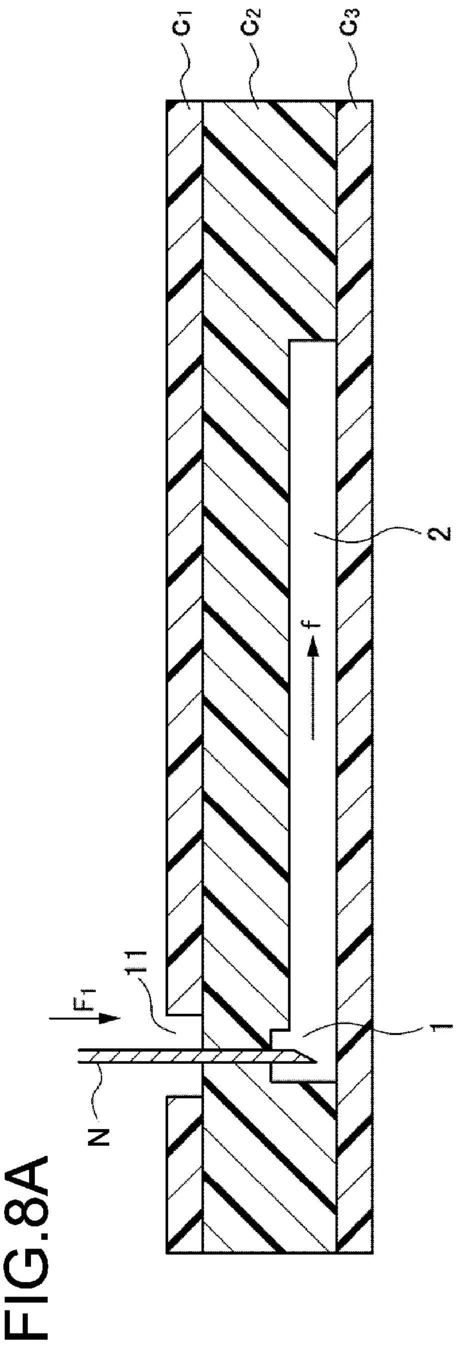
FIGS. 8A and 8B are cross-sectional schematic views illustrating a method of introducing a sample solution into the microchip C.

The sample solution is introduced into the microchip C, as shown in FIG. 8A, by puncture-injecting the sample solution into the injection site 1 with the needle N. In the figure, the arrow $F_1$ shows the puncturing direction of the needle N.

On the substrate layer $c_1$, a punctured hole 11 for puncture-injecting the sample solution into the injection site 1 from the outside is provided. The needle N is inserted into the punctured hole 11, to puncture the substrate layer $c_2$ from the surface of the substrate layer $c_2$ such that the tip part thereof can reach an inner space of the injection site 1.

Figure 9:
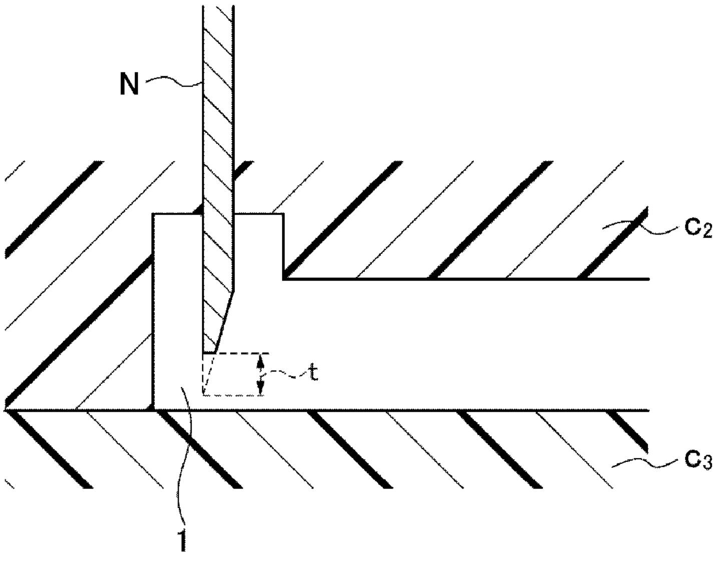
FIG. 9 is a schematic view illustrating a structure of a tip of a needle N.

At this time, when the tip of the needle N is processed to give a flat surface, as shown in FIG. 9, the needle N can be stably positioned when the needle N reaches the inner space of the injection site 1 and contacts the surface of the substrate layer $c_3$. The tip of the needle N can be processed by, for example, cutting off a part of a painless needle tip (see reference sign t in FIG. 9) to give a flat surface.

The sample solution introduced into the injection site 1 from the outside is sent toward the terminal site 5 in the main flow passage 2 (see arrow f in FIG. 8A), and the sample solution is introduced into the inside of the branched flow passages 3 and the wells 4 sequentially starting from the branched flow passage 3 and the well 4 arranged upstream of the sending direction of the solution.

At this time, because the inner pressure of the injection site 1, the main flow passage 2, the branched flow passages 3, the wells 4 and the terminal site 5 in the microchip C is set negative to atmospheric pressure, the sample solution introduced into the injection site 1 is sent to the terminal site 5 as aspirated due to the negative pressure, with the result that the sample solution can be smoothly introduced into the wells 4 or the like in the microchip C in a short time.

Further, when the inside of the injection site 1, the main flow passage 2, the branched flow passages 3, the wells 4 and the terminal site 5 is in vacuo, the introduction of the sample solution is not inhibited by air, or air voids are not generated inside the wells 4 or the like, because of the absence of air inside the wells 4 or the like.

Figure 8B:
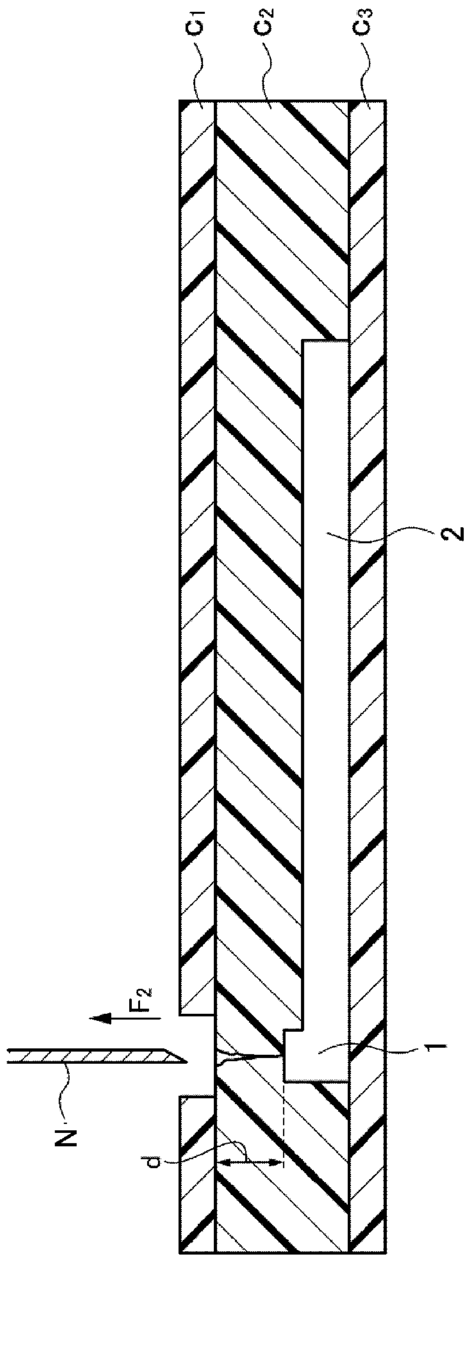

After the sample solution is introduced, as shown in FIG. 8B, the needle N is pulled out, and the punctured part of the substrate layer $c_2$ is sealed.

At this time, when the substrate layer $c_2$ is formed of the material having self-sealing property such as PDMS, the punctured part can be spontaneously sealed by the restoring force owing to the elastic deformation of the substrate layer $C_2$, after the needle N is pulled out.

In order to further improve the self-sealing property of the substrate layer $c_2$, it is desirable that a thickness from the surface of the substrate layer $c_2$ to the surface of the inner space of the injection site 1 at the punctured part (see reference sign d in FIG. 8B) be set within an appropriate range depending on the material for the substrate layer $c_2$ or the diameter of the needle N. When the microchip C is heated during the analysis, the thickness d is decided so that the self-sealing property is not lost due to the increase of the inner pressure caused by heating.

In each embodiment described above, the explanation has been made on the region formed on the microchip 5, calling the well 4, in which the substance contained in the sample solution or the reaction product of the substance is analyzed, but the region may have any shape such as a flow passage.

With the microchip according to each embodiment, a sample solution can be easily introduced in a short time, and the high precision of analysis can be obtained. Therefore, the microchip according to each embodiment can be desirably used in an electrophoresis apparatus in which multiple substances are separated in a flow passage on a microchip by electrophoresis and each substance separated is optically detected, a reaction apparatus (for example a real-time PCR apparatus) in which multiple substances are reacted in wells on a microchip and the resulting substances are optically detected, and the like.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A microchip comprising:

a substrate structure including a first substrate layer, a second substrate layer, and a third substrate layer, wherein the second and third substrate layers are provided in direct contact with opposite sides of the first substrate layer, and wherein each of the second and third substrate layers is a gas-impermeable substrate layer; and a fluid channel disposed between the first substrate layer and the second substrate layer, wherein the fluid channel includes at least one injection site, at least one fluid well, and at least one fluid flow passage provided in the first substrate layer, wherein the third substrate layer has a hole for injecting a sample solution, and wherein the at least one injection site is configured to be injected with the sample solution by injection through the hole and the first substrate layer, and wherein the fluid channel has a pressure lower than atmospheric pressure.

2. The microchip of claim 1, wherein the first substrate layer includes an elastic material.

3. The microchip of claim 2, wherein the elastic material includes at least one constituent selected from the group consisting of a silicone elastomer including polydimethyl siloxane, an acrylic elastomer, a urethane elastomer, a fluorine-containing elastomer, a styrene elastomer, an epoxy elastomer, and a natural rubber.

4. The microchip of claim 1, wherein the first substrate layer is a self-sealing substrate layer configured to allow the fluid channel to have the pressure lower than atmospheric pressure, and further allow self-sealing of the substrate structure subsequent to injection of the sample solution.

5. The microchip of claim 1, wherein the gas-impermeable substrate layer includes any one of a plastic material, a metal, and a ceramic.

6. The microchip of claim 1, wherein the at least one fluid well is configured to contain the sample solution or a reaction product thereof, and wherein the at least one fluid flow passage is configured to allow flow of the sample solution in fluid communication with the at least one injection site and the at least one fluid well.

7. The microchip of claim 1, wherein the gas-impermeable substrate layer comprises a plastic material selected from the group consisting of polymethyl methacrylate, polycarbonate, polystyrene, polypropylene, polyethylene, polyethylene terephthalate, diethylene glycol bisallyl carbonate, styrene-acrylonitrile copolymers, methyl methacrylate-styrene copolymers, poly(4-methyl pentene-1), polyolefins, siloxanyl methacrylate monomer-methyl methacrylate copolymers, siloxanyl methacrylate-fluorine-containing monomer copolymers, silicone macromer-heptafluorobutyl methacrylate-methyl methacrylate terpolymers, disubstituted polyacetylene polymers, and mixtures thereof.

8. A method of manufacturing a microchip, the method comprising:

forming a substrate structure and a fluid channel, the substrate structure including a first substrate layer, a second substrate layer, and a third substrate layer, wherein the second and third substrate layers are provided in direct contact with opposite sides of the first substrate layer, wherein each of the second and third substrate layers is a gas-impermeable substrate layer, wherein the fluid channel is disposed between the first substrate layer and the second substrate layer, wherein the fluid channel includes at least one injection site, at least one fluid well, and at least one fluid flow passage provided in the first substrate layer, wherein the third substrate layer has a hole for injecting a sample solution, and wherein the at least one injection site is configured to be injected with the sample solution by injection through the hole and the first substrate layer, and wherein the fluid channel has a pressure lower than atmospheric pressure.

9. The method of claim 8, wherein the first substrate layer includes an elastic material.

10. The method of claim 9, wherein the elastic material includes at least one constituent selected from the group consisting of a silicone elastomer including polydimethyl siloxane, an acrylic elastomer, a urethane elastomer, a fluorine-containing elastomer, a styrene elastomer, an epoxy elastomer, and a natural rubber.

11. The method of claim 8, wherein the first substrate layer is a self-sealing substrate layer configured to allow the fluid channel to have the pressure lower than atmospheric pressure, and further allow self-sealing of the substrate structure subsequent to injection of the sample solution.

12. The method of claim 8, wherein the gas-impermeable substrate layer includes any one of a plastic material, a metal, and a ceramic.

13. The method of claim 8, wherein the at least one fluid well is configured to contain the sample solution or a reaction product thereof, and wherein the at least one fluid flow passage is configured to allow flow of the sample solution in fluid communication with the at least one injection site and the at least one fluid well.

14. The method of claim 8, wherein the gas-impermeable substrate layer comprises a plastic material selected from the group consisting of polymethyl methacrylate, polycarbonate, polystyrene, polypropylene, polyethylene, polyethylene terephthalate, diethylene glycol bisallyl carbonate, styrene-acrylonitrile copolymers, methyl methacrylate-styrene copolymers, poly(4-methyl pentene-1), polyolefins, siloxanyl methacrylate monomer-methyl methacrylate copolymers, siloxanyl methacrylate-fluorine-containing monomer copolymers, silicone macromer-heptafluorobutyl methacrylate-methyl methacrylate terpolymers, disubstituted polyacetylene polymers, and mixtures thereof.

* * * * *